Sept. 27, 1966 W. BLACKFORD 3,275,907

SEMICONDUCTOR DEVICE MOUNTING WITH EMBEDDED THERMAL MATCHING CONTACT MEMBERS

Filed April 5, 1961

INVENTOR:
WILLIAM BLACKFORD,

BY Julius J. Zaskalicky
HIS ATTORNEY.

United States Patent Office 3,275,907
Patented Sept. 27, 1966

3,275,907
SEMICONDUCTOR DEVICE MOUNTING WITH EMBEDDED THERMAL MATCHING CONTACT MEMBERS

William Blackford, Fayetteville, N.Y., assignor to General Electric Company, a corporation of New York Filed Apr. 5, 1961, Ser. No. 100,899
2 Claims. (Cl. 317—234)

The present invention relates to mountings for the active semiconductive members or bodies of semiconductor devices and, in particular, is directed to providing improvements in fixed bed mountings for semiconductor devices of the kind described and claimed in a copending application by Philip N. Oakes and Ronald N. Wilkes, Serial Number 760,139, filed September 10, 1958, and assigned to the assignee of the present invention.

An object of the present invention is to simplify the construction of mounting structures of the kind described in the aforementioned patent application.

Another object of the present invention is to provide a semiconductor device which is mechanically rugged and is able to withstand great vibrational and shock stresses.

Still another object of the present invention is to provide a mounting structure in a semiconductor device which readily dissipates the heat developed in the semiconductor member of the device.

A further object of the present invention is to provide a simple mounting structure for the active elements of semiconductor devices whereby the assembly procedures for fabricating such devices are simplified and the cost thereof is reduced.

In carrying out the invention in one illustrative form, there is provided a generally planar insulating base member having a pair of leads extending therethrough substantially perpendicular to the major faces of said base member and a pair of planar conductive members embedded in said insulating base member and providing planar conductive surfaces elevated from the surface of said planar member. Each of said planar conductive members are insulated from one another and each extends close to and about a respective lead. A bar of semiconductor material is provided having a pair of end portions, each conductively secured to a respective one of said planar conductive members. Means are provided for separately securing each of said leads to a corresponding conductive planar member.

The features of this invention which are believed to be novel are set forth with particularity in the appended claims. The invention itself, however, both as to its organization and method of operation, together with further objects and advantages thereof may best be understood by reference to the following description taken in connection with the accompanying drawings, in which:

Figure 1:
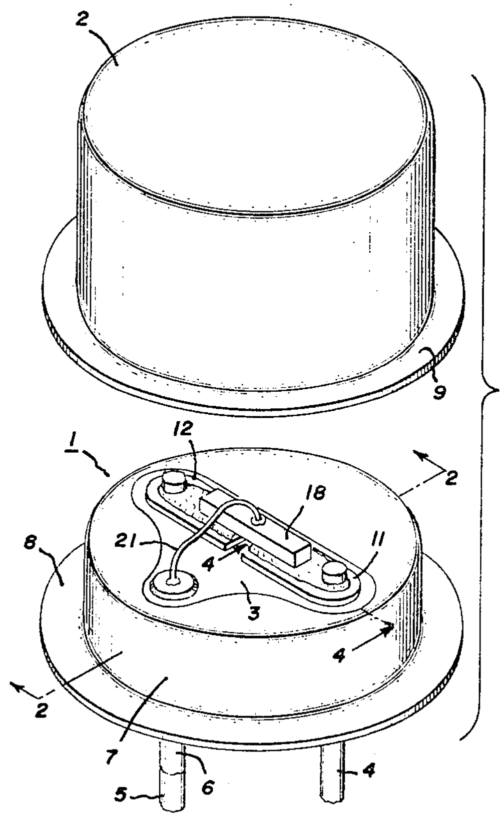
FIGURE 1 is a perspective view of a semiconductor device partly disassembled showing the mounting structure thereof in accordance with the present invention.
Figure 2:
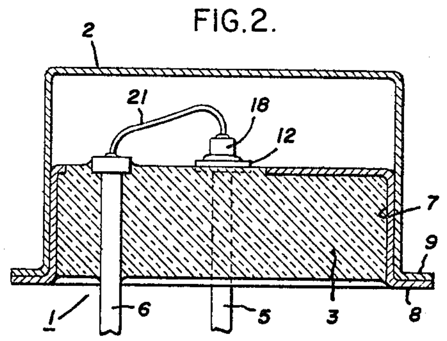
FIGURE 2 is a side view, in section, of the assembled device of FIGURE 1 taken along section 2—2 of FIGURE 1.

Referring now to FIGURES 1 and 2, the device shown comprises a header assembly 1 and a cap member 2 which, upon completion of fabrication of the header, may be assembled by welding or soldering of the mating flange portions thereof. The header member 1 comprises an insulating base portion 3 in which are embedded conductive leads 4, 5 and 6 and which is surrounded by a cylindrical conductive member 7 having a flange portion 8 adapted to engage flange portion 9 of the cap 2. A pair of planar conductive members 11 and 12 are provided as part of the header assembly embedded in the planar insulating base portion 3. The upper surface of each of the conductive members lies in a common plane elevated above the insulating portion 3. The conductive members 11 and 12 are spaced from one another and define a gap 13. They are also contiguous to but spaced by openings 14, 15 from respective leads 4, 5, as particularly illustrated in FIGURE 3. The materials which may be used for conductive members 11 and 12 and leads 4, 5 and 6 are materials such as fernico or Kovar, which have temperature coefficients of expansion matching that of glass. These latter materials are alloys or iron, nickel and cobalt of various proportions well known in the art for this purpose. Fernico is a well-known alloy of iron, nickel and cobalt, having a coefficient of expansion similar to that of glass and hermetically bonds thereto.

Figure 3:
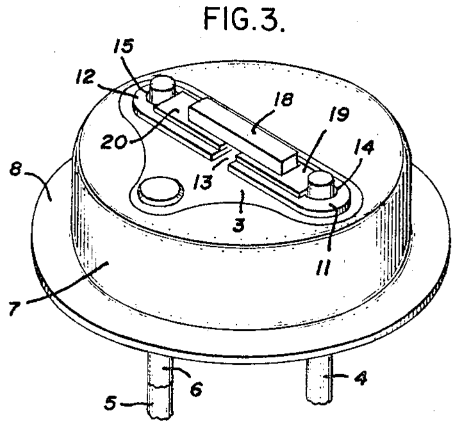
FIGURE 3 is a perspective view of a portion of the device of FIGURE 1 showing a step in the assembly of the device.
Figure 4:
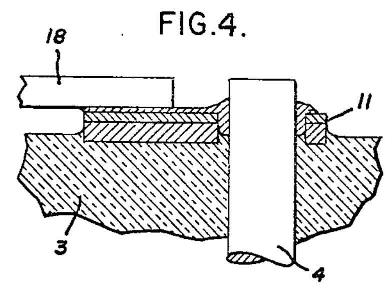
FIGURE 4 is a section view of a part of the device of FIGURE 1 taken along section 4—4 showing a constructional feature and fabrication procedure for the device of FIGURE 1.

A bar of semiconductor material 18 is conductively secured at its ends to the conductive members 11 and 12 by means of a suitable solder which may be applied in the form of preforms 19, 20 as illustrated in FIGURE 3 or may be plated on the conductive members 11 and 12. The same solder material may be used to make conductive connection between the metallic members and the leads, for example, in a one-step fusion process, as more particularly shown in FIGURE 4. The construction described above in which conductive connection is made between the leads and the conductive member during the fabrication thereof simplifies the assembly of the device and the cost thereof, as well as improves its performance. A flexible wire-like conductor 21 is fused to an intermediate portion of the bar and bonded by suitable means such as thermocompression or ultrasonic bonding to the lead 6.

Preferably conductive members 11 and 12 are bimetallic in construction. The bottom portion thereof is bonded to the glass and is of a material such as fernico which bonds to glass and has a thermal coefficient of expansion comparable thereto. The top portions are formed of such materials as copper or molybdenum which are good heat conductors. Such bi-metallic members may be formed from sheets formed by cold welding or other techniques well known to those skilled in the art. Copper may be used in signal devices or low-current devices to provide good heat conduction from the bar mounted thereon. In devices designed to handle large amounts of power, considerable heat is developed, causing a substantial rise in the temperature of the semiconductor element and the conductive members. In such applications the top portions of the conductive members are more suitably made of a material such as molybdenum of suitable dimensions. The molybdenum more nearly matches the thermal coefficient of expansion of such semiconductor elements as silicon and germanium than copper and thus stresses produced by differential expansion of the contact materials are minimized.

Preferably, the solder material preforms or plates 19 and 20 are of a material which makes good mechanical and electrical bond to the semiconductor bar. Gold is a good solder material. If the bar of semiconductor material is of N-type conductivity, a very small percentage of antimony alloyed with the gold to assure an ohmic contact would be used, for example, a gold-antimony preform consisting of 99.4 percent gold and 0.6 percent antimony.

The device shown in FIGURE 1 is a unijunction transistor such as described and claimed in United States Patent 2,769,926. Such a device comprises a bar of semi-conductor material, for example, silicon, of either N or P-type conductivity. For the purposes of illustration, it is assumed that a bar of N-type conductivity is used. In such a case, the metal preforms would advantageously be formed of the gold-antimony alloy mentioned above. If a P-type bar were used, the preforms would be made of a suitable alloy, such as gold-aluminum alloy, 99 percent gold and one percent aluminum. The bar is placed on the conductive members 11 and 12 spanning the gap 13. The bar and header are then heated, causing the preforms 19 and 20 to partially fuse and bond the bar to the conductive members 11 and 12 and at the same time conductively solder each of the conductive members to a respective lead. Thereafter, a wire of aluminum, a P-type conductivity-inducing material, is placed adjacent one edge of the gap, heated to cause alloying and recrystallizing of the wire with the silicon to form a P-type conductivity region therein. The other end of the wire is then bonded to the conductive lead 6.

Though one form of the invention has been described in connection with a unijunction transistor, it will be apparent that other semiconductor devices, such as conventional transistors, transistor tetrodes, diodes, etc., may be readily mounted in accordance with the invention. In conventional transistors, the bar is mounted on the conductive members so that the base region thereof registers with the gap and is free of contact with the conductive members. Conductive connection is made to the emitter, collector and base regions of the transistor in a manner similar to the manner used for making connections to the end and intermediate regions of the unijunction transistor. If it is desired to make more than three connections to the transistor, additional leads and the metallic members may be provided. While the insulating base member may conveniently be glass or any other suitable insulating material in which conductive members may be secured, preferably the base member should be a relatively good heat conductor as well as a good insulator.

The structures described in FIGURES 1 and 2 are structures which are mechanically simple and easy to fabricate. They are structures which are mechanically rugged and are able to withstand tremendous shocks. The insulating base member essentially forms a backing for the fragile semiconductor elements of the device and, in addition, being in good mechanical and conductive contact with large metallized areas assures good heat flow from the heat-generating parts of the semiconductor elements. With such a mounting, transistor bars need not be held to such close overall tolerances and, in addition, in view of the flush mounting of the bars to the base supporting member itself, the overall dimensions of the completed device are kept to a minimum.

While specific embodiments have been shown and described, it will, of course, be understood that various modifications may be devised by those skilled in the art which will embody the principles of the invention and found in the true spirit and scope thereof.

What I claim as new and desire to secure by Letters Patent of the United States is:

1. A semiconductor device comprising a generally planar insulating base member having a pair of leads extending therethrough substantially perpendicular to the major faces of said base member, a pair of respective planar conductive members adjacent the respective leads, each conductive member including a metal plate embedded in said base member and providing a planar conductive surface elevated from the surface of said base member, said conductive members being in insulated relationship with respect to one another and each having a portion closely spaced from the respective lead to which it is adjacent, a bar of semiconductor material having a pair of end portions, one of said end portions being conductively secured to one of said conductive members by a first mass of solder which extends to and forms a conductive connection with one of said leads, and the other of said end portions being conductively secured to the other of said conductive members by a second mass of solder which extends to and forms a conductive connection with the other of said leads.

2. A semiconductor device comprising a generally planar insulating base member having a pair of leads extending therethrough substantially perpendicular to the major faces of said base member, a pair of planar conductive members adjacent the respective leads, each inductive members having one planar portion thereof of a material having a thermal coefficient of expansion comparable to that of the insulating member and embedded therein and a second planar portion thereof bonded to said one portion and of a material which has good thermal and electrical conductivity, said conductive members being in insulated relationship with respect to one another and each having a portion closely spaced from the respective lead to which it is adjacent, one of said end portions being conductively secured to the second planar portion of one of said conductive members by a first mass of solder which extends to and forms a conductive connection with one of said leads, and the other of said end portions being conductively secured to the second planar portion of the other of said conductive members by a second mass of solder which extends to and forms a conductive connection with the other of said leads.

References Cited by the Examiner

UNITED STATES PATENTS

| | | | |
|---|---|---|---|
| 3,021,461 | 2/1962 | Oakes et al. | 317—235 |
| 3,025,439 | 3/1962 | Anderson | 317—240 |
| 3,159,775 | 12/1964 | Ingraham | 317—234 |

JOHN W. HUCKERT, *Primary Examiner.*

A. S. KATZ, R. SANDLER, *Assistant Examiners.*